United States Patent [19]

Papoff et al.

[11] 3,935,971

[45] Feb. 3, 1976

[54] DOUBLE PUMP DEVICE FOR MIXING TWO OR MORE LIQUIDS WITH VARIABLE RELATIVE RATIOS AND CONCENTRATIONS

[75] Inventors: Paolo Papoff; Dante Guidarini, both of Bari; Carlo Fragale, Cosenza, all of Italy

[73] Assignee: Consiglio Nazionale Delle Ricerche, Rome, Italy

[22] Filed: May 23, 1974

[21] Appl. No.: 472,848

[30] Foreign Application Priority Data
May 30, 1973   Italy.................................. 73/50345

[52] U.S. Cl. .................. 222/134; 222/26; 417/426; 318/678
[51] Int. Cl.² ......................................... B67D 5/60
[58] Field of Search ....... 417/426; 137/99; 318/678, 318/8; 222/26, 134

[56]        References Cited
           UNITED STATES PATENTS

| | | |
|---|---|---|
| 3,398,689 | 8/1968 | Allington .............................. 137/99 |
| 3,427,520 | 2/1969 | Oppedahl............................ 318/678 |
| 3,523,228 | 8/1970 | Currie et al......................... 318/678 |
| 3,559,008 | 1/1971 | Stut et al. ................................. 318/8 |
| 3,565,286 | 2/1971 | Latham, Jr........................... 417/426 |
| 3,771,032 | 11/1973 | Hender..................................... 318/8 |

*Primary Examiner*—C. J. Husar
*Attorney, Agent, or Firm*—Young & Thompson

[57]        ABSTRACT

A double pump device for mixing with variable ratios and concentrations two or more liquids, comprising in combination: a first peristaltic pump, and a second peristaltic pump, each of said pumps acting on a plurality of collapsible tubes, said pumps being operated by two electric motors, interdependant and preferably identical to each other, driven by an electronic circuit comprising as main elements a differential amplifier and circuitry means for adjusting the input voltage of the differential amplifier and for amplifying the output signals from the differential amplifier before their application to the two driving motors.

6 Claims, 7 Drawing Figures

DOUBLE PUMP DEVICE FOR MIXING TWO OR MORE LIQUIDS WITH VARIABLE RELATIVE RATIOS AND CONCENTRATIONS

The present invention relates to a double pump device for mixing and/or metering with variable relative ratios and concentrations two or more liquids.

More particularly, the present invention relates to a device comprising two interdependent peristaltic pumps, particularly suitable for producing solutions or suspensions of two liquids besides the relative solvent, so that it will be possible to adjust at will and independently not only the relative ratio between the two liquids, but also the concentration of the solution or dispersion.

Peristaltic pumps for the metered pumping of liquids are known in the art. Said pumps comprise, as essential components, a portion of collapsible tube subjected to a progressive squeezing action due to the action of a roller or a cam, so as to cause the forced forwards movement of the liquid contained in said portion of tube, which of course makes part of a complete circuit.

The main purpose of this invention is that of providing a unit including two peristaltic pumps, each of which operates on two or more collapsible tubes, controlled by an electronically adjusted driving system so that the two pumps will have pumping speed or rates of flow of the liquid continuously variable with an interdependence relation according to which while the speed of one of the pumps will be increased or decreased according to a certain rule, the speed of the other pump will be decreased or increased, respectively, according to the same rule.

As each pump can operate on two or more collapsible tubes, the device according to this invention allows one to draw by the single tubes different liquids and to obtain a mixture of the liquids according to desired ratios, or solutions wherein it will be possible to change continuously both the relative ratio(s) between the liquids and their concentration in the solution.

The operating system for the two peristaltic pumps comprises two interdependent electric motors the rotors of which are driven by a differential amplifier, one input of the differential amplifier being fed with a fixed reference potential and the other being fed with a potentiometer, the adjustment of which, determines thus the variation of the two outputs of the differential amplifier. It will be thus understood that by acting on the input adjusting potentiometer it will be possible to obtain the increase of the number of revolutions of one motor and the interdependent diminution of the number of revolutions of the other motor.

A further characteristic of this invention consists in that the course of the delivery ratio of the different liquids and/or of their concentration can be nonlinear. In fact, if the various collapsible tubes have different diameters, the behaviour of said parameters will no longer be linear, but will depend upon the ratios of the cross sections of the concerned tubes.

A further advantage of the present invention consists in that although a trimming potentiometer is provided, the device has a single adjusting member, and precisely a potentiometer as a function of the setting of which there are obtained the desired variations in the ratios between liquids and in their concentration.

In an embodiment at present preferred, which will be described hereinafter in detail, the present invention includes in combination two peristaltic pumps, each of which operates on two collapsible tubes having one a cross section double than the other, but equal two-by-two; said pumps being operated by two electric motors interdependent and alike, driven by an electronic circuit comprising as basic components a differential amplifier and a circuitry for the input adjustment of the differential amplifier and for amplifying the output signals from the differential amplifier to be applied to the two operating motors.

The differential amplifier is embodied by a double transistor to the first base of which is applied an adjustable input potential, to the second base of which a fixed potential is applied, and the cited means for controlling the input of the differential amplifier comprise a first potentiometer which supplies the adjustable potential to the first base of the double transistor and a second alignment potentiometer, in series with the first potentiometer. A transistor, acting as a constant current generator is connected to the emitters of the double transistor and has a potentiometer in the base biassing circuit for adjusting the operating point of the differential amplifier.

Further features and advantages of the present invention will appear clearly from the specification of a preferred embodiment thereof disclosed with reference to the attached drawings which are to be considered as exemplary rather than limitative.

Figure 2:
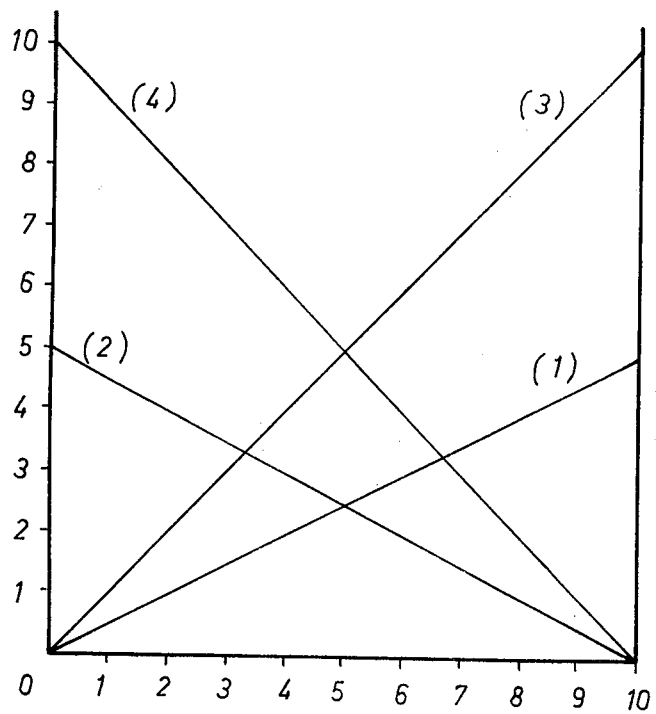
FIG. 2 shows the variations of flow in a device like that of FIG. 1, wherein each of the two pumps acts on two collapsible tubes, one of said tubes having a cross section area double the cross sectional area of the other, the cross sectional areas being equal two by two.
Figure 5:
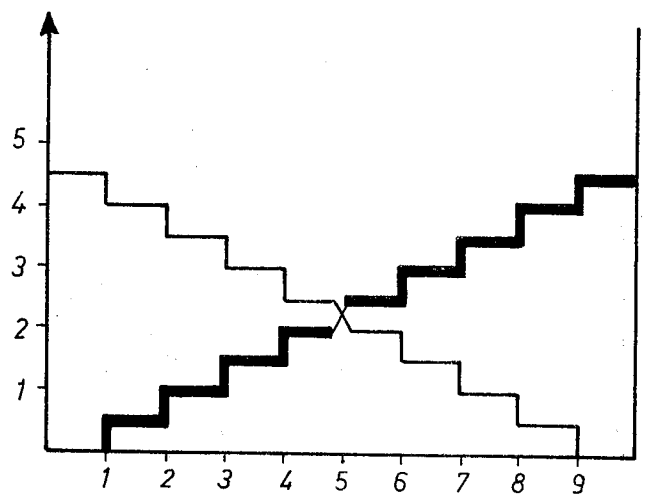
Figure 6:
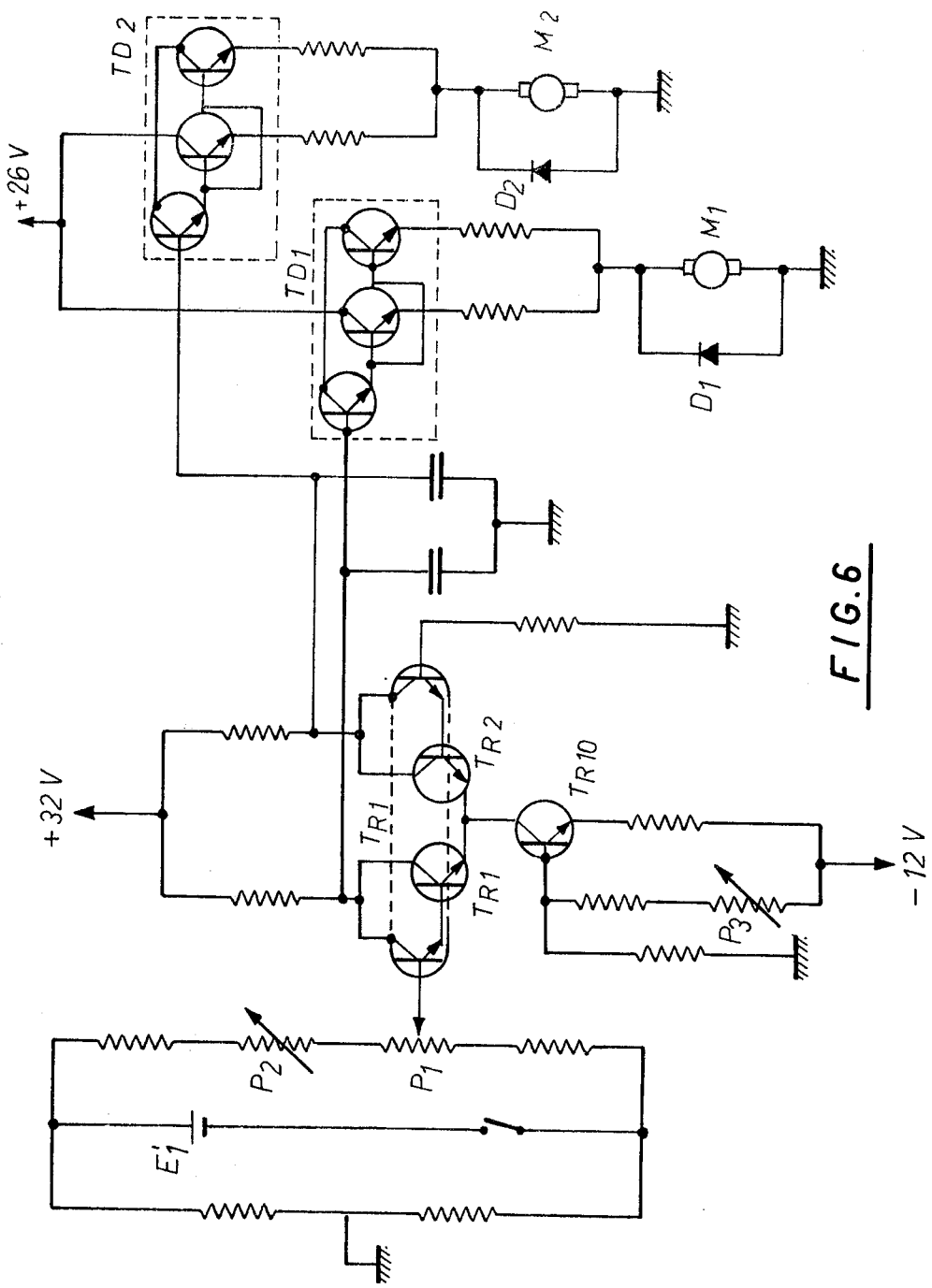

FIG. 5 shows the variations of the flow of rate of two liquids in an operating mode of the device according to this invention, similar to the mode of operation shown in FIG. 2, in the case of step variations of the variable voltage on one of the inputs of the differential amplifier. In order to obtain this behaviour it will be assumed that the jumps will be effected at constant intervals of time; and FIG. 6 shows the electric circuit for driving the double pump device.

Figure 7:
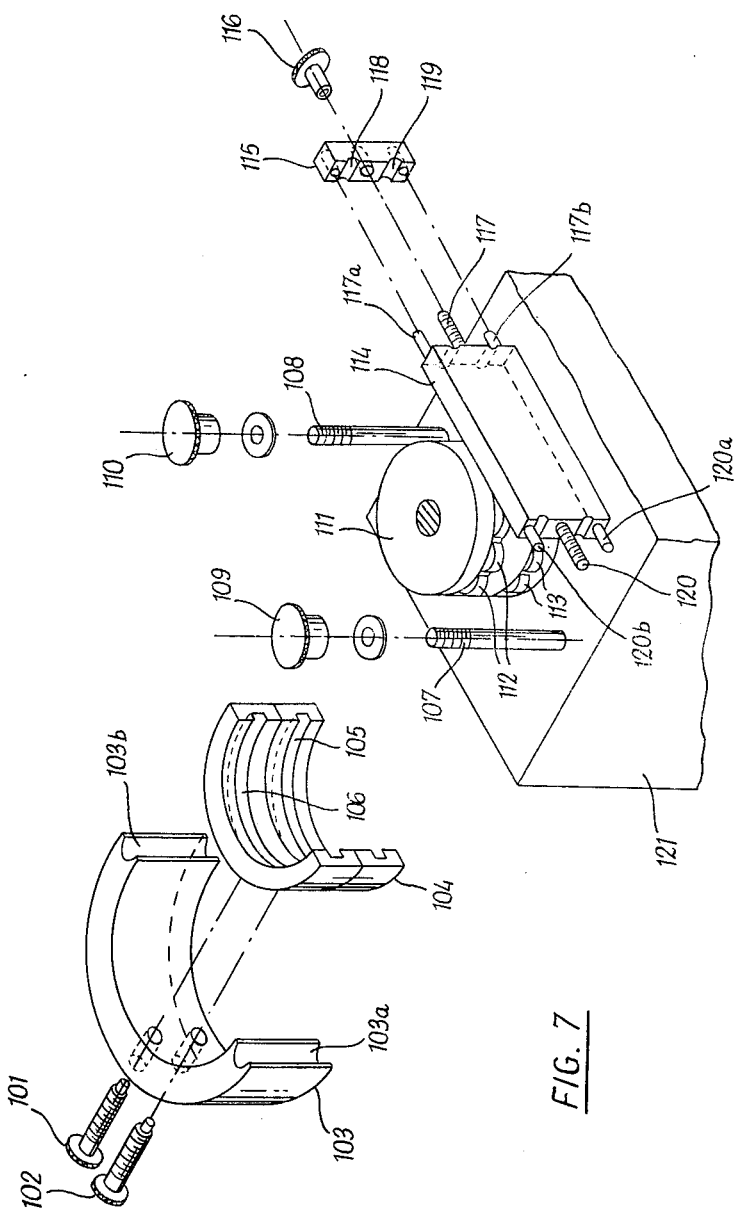

FIG. 7 shows an exampling embodiment of a peristaltic pump operating according to the invention.

The device according to this invention will be first disclosed with reference to its mechanical aspect and then the electronic driving of the two motors therein used will be described.

Figure 1:
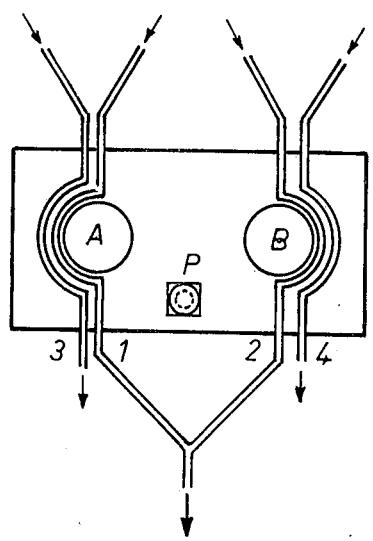
FIG. 1 is a diagrammatic view of the double peristaltic pump device according to this invention.

As shown in FIG. 1, the device comprises two peristaltic pumps A and B, each of which operates on two collapsible tubes, and precisely: the pump A acts on the tubes 1 and 3 and the pump B acts on the tubes 2 and 4.

It is assumed that the structure in detail of the two peristaltic pumps A and B is known to a person skilled in the art, and therefore a detailed description thereof, from this standpoint is deemed unnecessary.

The operating principle is not bound to the cross sectional areas of the tubes 1, 2, 3 and 4, but in this embodiment it will be assumed that the tubes 3 and 2 have a cross sectional area double than the corresponding cross sectional areas of the tubes 1 and 4. The device comprises also a potentiometer P for adjusting the rates of flow; the operation of the potentiometer P causes, by means of the driving circuitry which will be described later on, the speed of a pump to be increased or decreased according to a certain rule, while the speed of the other pump will be decreased or increased by the same rule.

Therefore, while the rate of flow of the liquid through the independent tubes varies linearly from zero up to the maximum rated value, simultaneously the rate of the flow through the tubes 2 and 4 varies linearly from the maximum value, a function of the diameter of the tubes, down to zero. This has been shown in FIG. 2.

It will be understood that if the liquids of the tubes 1 and 2 and, separately the liquids of the tubes 3 and 4 are mixed at their outlet, the total rate of flow of the two tubes 1 and 2, and the total rate of flow of the two tubes 3 and 4 will remain constant over the range of adjustment of the potentiometer P; while the ratio between the amount of liquid pumped in a unit of time through the tube 1 and the amount pumped through the tube 2; can be varied. The same is true for the amounts of liquid pumped through the tubes 3 and 4.

It will also be understood that according to the electric characteristics of the controlling device, the rates of flow can be caused to vary in linear or non-linear mode, according to a pre-established rule, by manipulating the knob of the potentiometer.

Some modes of operation of the device will be now described, assuming the use of tubes having equal diameters.

MODE I.

If a liquid L1 is drawn by the tube 1, and by means of the tube 2 a suitable solvent will be drawn, after the mixing at the outlet, a solution will be obtained wherein the amount, namely the concentration of the liquid L1 is variable linearly from zero to 100%. Thus it will be possible to easily prepare a set of standard solutions. Graphically this mode of operation is shown in FIG. 2, considering only the pair of tubes 1 and 2 or only the pair 3 and 4.

MODE II.

If by the tube 1 the liquid L1 is drawn, and by the tube 3 the liquid L2 is drawn, and by the tubes 2 and 4 a suitable solvent is drawn, after the mixing, a constant rate of flow system will be obtained, wherein the amounts, i.e. the concentrations of L1 and L2 respectively increase continuously although maintaining ulaltered their ratio, depending upon the cross sectional area of the tubes 1 and 3. Thus it will be possible to prepare standard solutions with variable concentrations of two compounds the mutual ratio of which, remains unaltered.

MODE III.

Figure 3:
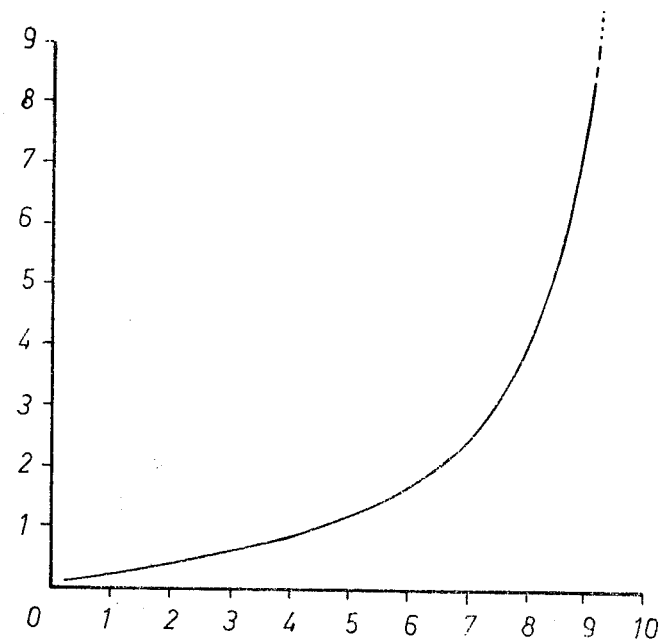
FIG. 3 shows a curve showing the ratio between two liquids drawn with two tubes in an operating mode of the device according to this invention.

If by the tube 1 the liquid L1 will be drawn, and by the tube 2 the liquid L2 will be drawn a constant flow system will be arranged wherein by increasing the amount of L1 and decreasing likewise the amount of L2, the L1/L2 ratio varies from zero to infinite, with the course as shown in FIG. 3.

MODE IV.

Figure 4:
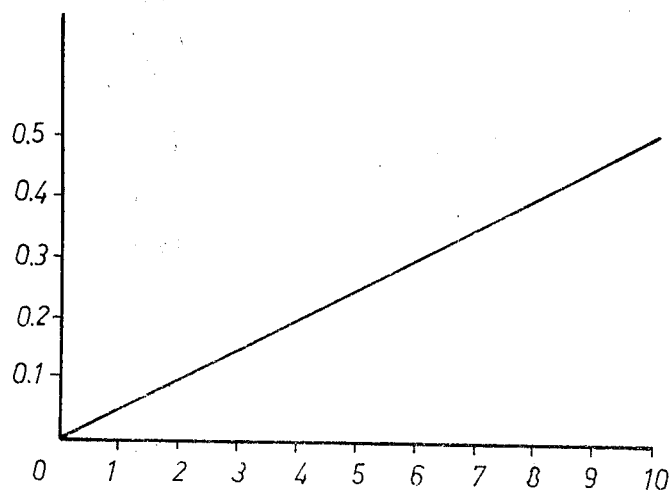
FIG. 4 shows the course of the ratio between two liquids pumped by the device in a different mode of operation.

By the tube 1 the liquid L1 will be drawn, and by the tubes 2 and 3 the liquid L2 will be drawn, while by the tube 4 a solvent will be drawn, at the outlet a constant flow system will be obtained wherein as the amount of the liquid L2 remains constant and that of the liquid L1 varies from zero to a certain maximum value the ratio L1/L2 of the two liquids varies from zero to a finite value as shown in FIG. 4.

Implicitly, the assumption has been made up to now that the adjustment of the potentiometer P1 is made in a continuous mode. The operating principle, however, will not be altered if the adjustment of the potentiometer will be made in discontinuous way or anyway, non-linearly. In FIG. 5 for instance it will be possible to observe how the curves of FIG. 1 showing the rates of flow of the liquids L1 and L2 will be modified if the adjustment of the potentiometer, and therefore of the input voltage of the differential amplifier would occur by discrete steps.

The control device will be now described allowing one to adjust automatically one of the pumps as a function of the other, so that to a positive increment of the first pump an equal negative increment of the second pump will correspond and vice-versa.

The control device comprises a differential amplifier consisting of the double transistor TR1 and of two equal transistors TR2 the bases of which are respectively connected to the emitters of TR1 and the collectors are connected directly to the collectors of said double transistor TR1. The emitters of said transistors TR2 and TR1, are connected together in a common point and to the transistor TR10 acting as a constant current source. The adjustment of the operating point of the differential amplifier is obtained by varying the base biassing of the transistor TR10 by means of a potentiometer P3.

The variable input of the transistor TR1 is taken out through a potentiometer P1 in series with which a potentiometer P2 acting as a trimming potentiometer is provided, the two potentiometers P1 and P2 being connected to the terminals of the voltage generator E1.

The trimming potentiometer P2 allows the speeds of the two motors operating the pumps A and B to be rendered equal, maintaining the potentiometer P1 in a position approximately central so as to be able to effect any adjustment in either direction, of the relative speed of the two motors.

The outputs from the differential amplifier are applied directly through two Darlington amplifier circuits TD1, TD2 to the armatures of the two motors M1 and M2 having in parallel two diodes D1 and D2 respectively as protection against the back electromotive force.

The operative and circuitry details of the differential amplifier and of the Darlington amplifiers are not deemed necessary for understanding their operation, as said circuitry is well known in the art.

In FIG. 7 there is shown an exemplary embodiment of one of the peristaltic pumps useful for operating with the system according to the invention.

The pump (only one of them is shown, the other being identical), comprises a drum 111 rotatably mounted on a base 121, and driven by an electric motor not shown. The drum 111 carries a double crown of rollers 112, 113 arranged for squeezing collapsible tubes housed in the grooves 105, 106 of the holding member 104. The holding member 104 is secured by means of a clamp comprising a "C" member 103 to which the holding member is fastened removably with the screws 101, 102.

The clamp 103 comprises grooves 103a, 103b mating with the dowels 107, 108 whereon said clamp 103 is locked with thumbnuts 109, 110. On the base 120 there is mounted a block 114, in closely spaced relationship with the drum 111. The block 114 comprises stud bolts 117, 120 and centering pins 117a, 117b and 120a, 120b nesting in corresponding holes machined in the clamp 115 (only one shown). The clamp 115 comprises slots 118, 119 arranged for clamping without squeezing the collapsible tubes. The clamp 115 can be removably fastened with the thumbnut 116.

It will be clear that the construction of the pump as shown allows one to maintain an absolute cleanliness between experiments because the collapsible tubes may be disposable avoiding thus a cross contamination with residual materials from former operations.

The present invention has been described in one preferred embodiment thereof, but the persons skilled in the art will be able to effect modifications and changes in the constructive details without thereby departing from the scope of the appended claims.

Having thus described the present invention, what is claimed is:

1. A double pump device for mixing with variable ratios and concentrations two or more liquids, comprising in combination: a first peristaltic pump, and a second peristaltic pump, each of said pumps acting on a plurality of collapsible tubes, some of said tubes having a crosssectional area different from others of said tubes, said pumps being operated by two electric motors, driven by an electronic circuit comprising as main elements a differential amplifier and circuitry means for adjusting the input voltage of the differential amplifier and for amplifying the output signals from the differential amplifier before their application to the two driving motors so that the speeds of the motors vary inversely to each other.

2. A double pump device as claimed in claim 1 characterized in that said differential amplifier comprises a double transistor to one base of which a variable potential is applied, said variable potential being adjustable by said means for adjusting the input voltage, while to the second base, a fixed potential will be applied.

3. A double pump device as claimed in claim 2, characterized in that the input adjusting means for the differential amplifier include a first potentiometer, supplying the variable voltage to the first base of the double transistor, and a second trimming potentiometer in series with the first cited potentiometer; the two potentiometers being connected to a voltage generator.

4. A double pump device as claimed in claim 1, characterized in that for adjusting the operating point of the differential amplifier, a constant current generator is provided including a transistor with a potentiometer inserted into its base biassing circuit, said current generator being connected to the centre reference point of said differential amplifier.

5. A double pump device as claimed in claim 1 characterized in that the means for amplifying the output voltages of the differential amplifier before their application to the pump operating motors, consist of Darlington amplifier circuits.

6. A double pump device as claimed in claim 1 characterized in that means are provided for admixing liquid from at least one tube of one pump with liquid from at least one tube of the other pump.

* * * * *